United States Patent
Ogiso

(10) Patent No.: US 9,132,958 B2
(45) Date of Patent: Sep. 15, 2015

(54) CIRCUIT BOARD TRANSPORTATION DEVICE, CIRCUIT BOARD WORKING APPARATUS, AND CONVEYOR BELT

(71) Applicant: YAMAHA HATSUDOKI KABUSHIKI KAISHA, Shizuoka-ken (JP)

(72) Inventor: Takeshi Ogiso, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 0 days.

(21) Appl. No.: 14/043,623

(22) Filed: Oct. 1, 2013

(65) Prior Publication Data

US 2014/0097068 A1    Apr. 10, 2014

(30) Foreign Application Priority Data

Oct. 5, 2012 (JP) .................................. 2012-222834

(51) Int. Cl.
| | |
|---|---|
| B65G 15/00 | (2006.01) |
| H05K 13/00 | (2006.01) |
| B65G 15/30 | (2006.01) |
| B65G 15/46 | (2006.01) |

(52) U.S. Cl.
CPC .............. B65G 15/00 (2013.01); B65G 15/30 (2013.01); H05K 13/0061 (2013.01); B65G 15/46 (2013.01)

(58) Field of Classification Search
USPC ................................ 198/817, 837, 841, 836.1
See application file for complete search history.

(56) References Cited

U.S. PATENT DOCUMENTS

| | | | | |
|---|---|---|---|---|
| 5,048,669 A | * | 9/1991 | Swinderman | 198/525 |
| 5,311,979 A | * | 5/1994 | Risley et al. | 198/453 |
| 6,142,293 A | | 11/2000 | Ozawa et al. | |
| 6,176,367 B1 | * | 1/2001 | Patrito | 198/817 |
| 8,783,447 B1 | * | 7/2014 | Yohe et al. | 198/841 |

FOREIGN PATENT DOCUMENTS

| | | |
|---|---|---|
| EP | 0774597 A1 | 5/1997 |
| EP | 0930816 A1 | 7/1999 |
| JP | H05-283895 A | 10/1993 |

(Continued)

OTHER PUBLICATIONS

The extended European search report issued by the European Patent Office on Nov. 6, 2014, which corresponds to European Patent Application No. 13004621.2-1803 and is related to U.S. Appl. No. 14/043,623.

(Continued)

Primary Examiner — Leslie A Nicholson III
(74) Attorney, Agent, or Firm — Studebaker & Brackett PC

(57) ABSTRACT

The circuit board transportation device has: a guide member that is provided in such a manner as to extend in the transport direction and has a guide surface that comes into abutment with a circuit board from the outside of the circuit board in a perpendicular direction that is a direction perpendicular to the transport direction; a conveyor belt that extends in the transport direction to support an end of the circuit board; and a drive unit that moves the conveyor belt. The conveyor belt has: a belt base portion that is located under the guide member and extends both ways of the perpendicular direction from the position of the guide surface; and a projection that extends upward from the belt base portion up to a position between upper and lower ends of the guide surface. The conveyor belt supports the circuit board by means of the projection.

11 Claims, 6 Drawing Sheets

(56) References Cited

FOREIGN PATENT DOCUMENTS

| | | |
|---|---|---|
| JP | H11-199043 A | 7/1999 |
| JP | 2000-264414 A | 9/2000 |
| JP | 2003-089411 A | 3/2003 |
| JP | 2009-289780 A | 12/2009 |
| KR | 10-0378845 B1 | 7/2003 |

OTHER PUBLICATIONS

An Office Action issued by the Korean Patent Office on Oct. 31, 2014, which corresponds to Korean Patent Application No. 10-2013-117145 and is related to U.S. Appl. No. 14/043,623; with English language summary.

\* cited by examiner

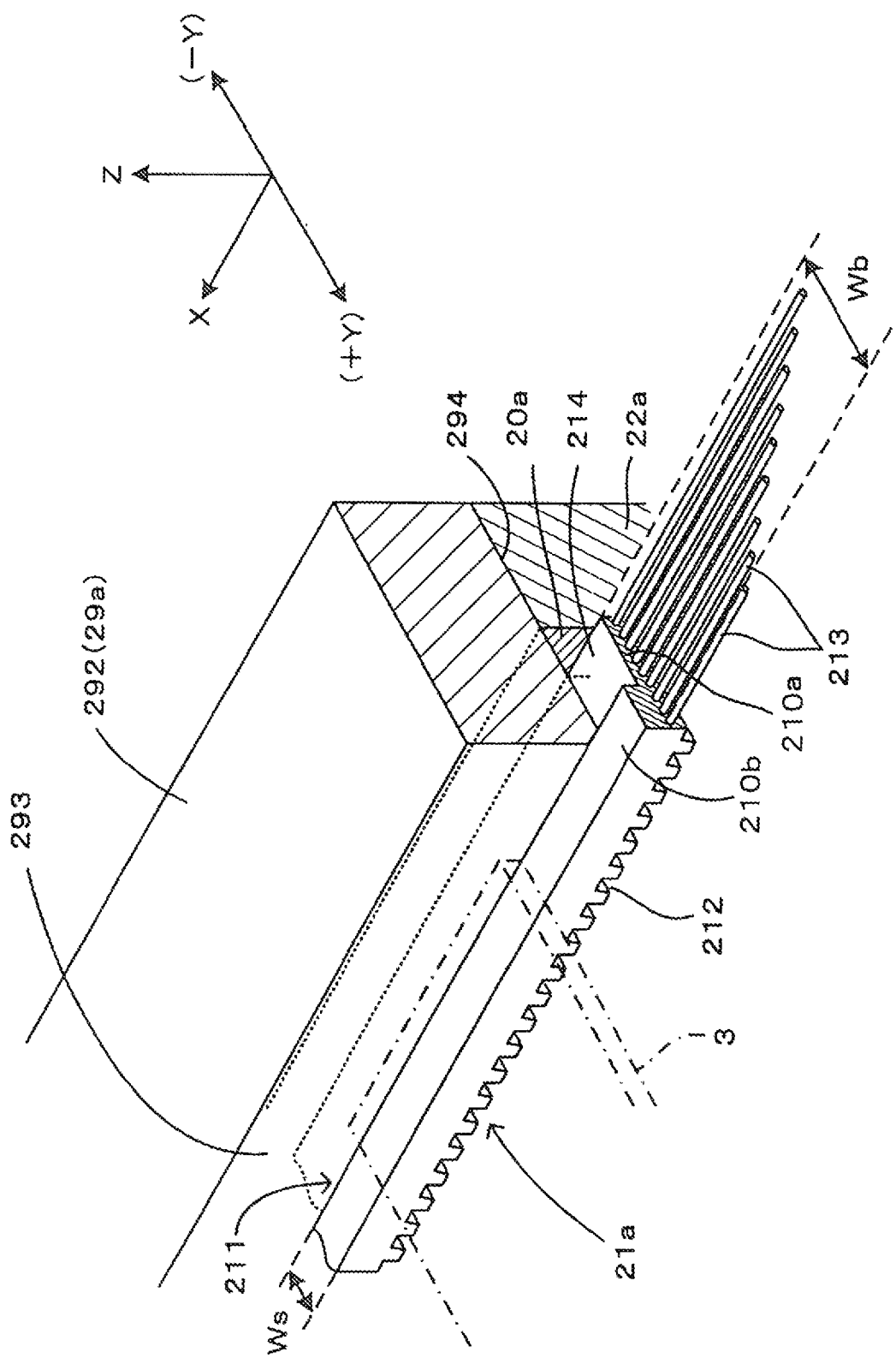

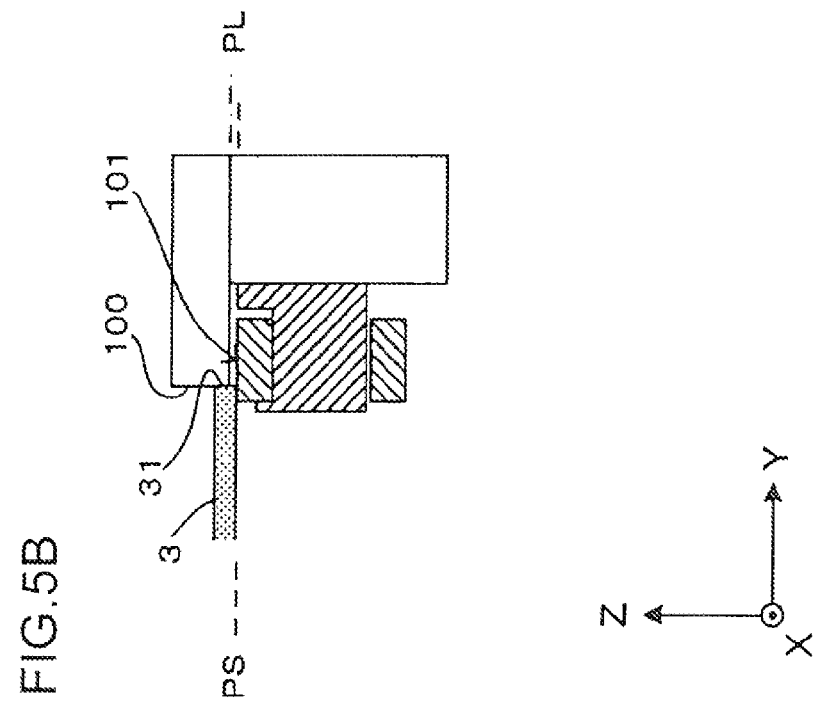
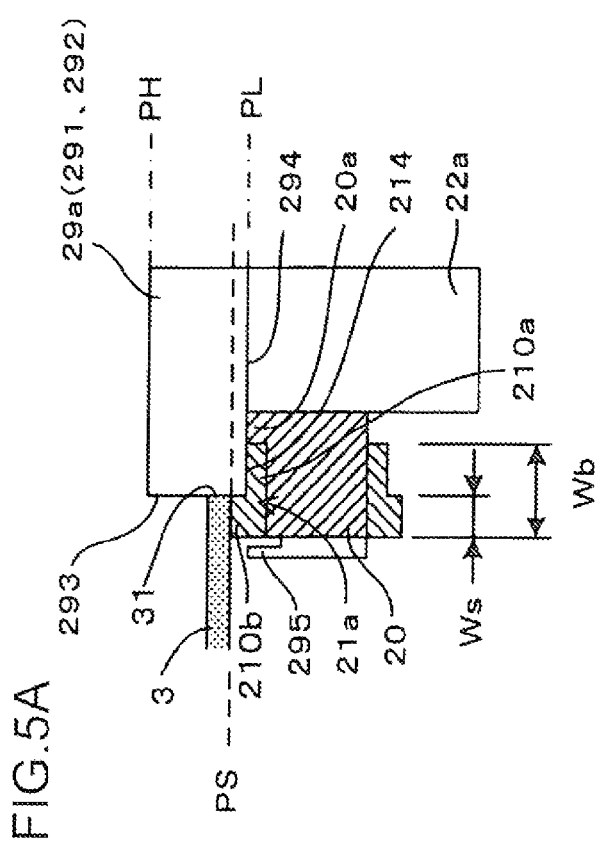
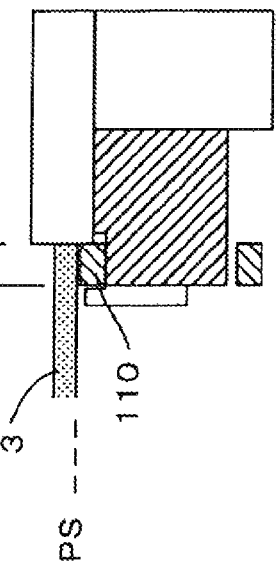

CIRCUIT BOARD TRANSPORTATION DEVICE, CIRCUIT BOARD WORKING APPARATUS, AND CONVEYOR BELT

BACKGROUND OF THE INVENTION

1. Field of the Invention

The present invention relates to a circuit board transportation device for transporting a circuit board, a circuit board working apparatus for executing a predetermined operation on a circuit board transported to an operation position by a circuit board transportation device, and a conveyor belt suitable for a circuit board transportation device. Examples of the operation carried out by the circuit board working apparatus include surface mounting, circuit board inspection, application of coating, printing, and reflow of a circuit board mounted with parts.

2. Background Art

In a circuit board working apparatus such as a surface mounter, a circuit board is carried into an operation position and then carried out of the operation position upon completion of an operation executed thereon. For the purpose of transporting a circuit board in this manner, the circuit board working apparatus is equipped with a circuit board transportation device. The circuit board transportation device described in, for example, Japanese Patent Application Publication No. 2009-289780 (FIG. 3) has a pair of right and left conveyor belts. This circuit board transportation device has a conventional general flat belt as each of these conveyor belts. Each conveyor belt supports a circuit board by its internal section in a cross direction (lateral direction) and moves (runs) by being driven by a drive motor, to transport the circuit board. Also, guide members are provided corresponding to the conveyor belts respectively. Each of the guide members covers from above an outer end of the corresponding conveyor belt in the cross direction. The guide members have upright guide surfaces on the inside thereof in the cross direction, and take advantage of these guide surfaces to guide side end surfaces of the circuit board transported by the conveyor belts, to keep the circuit board during transportation in a fixed position. This circuit board transportation device stabilizes transportation of a circuit board in this manner. This circuit board transportation mode described in Japanese Patent Application Publication No. 2009-289780 is referred to as "prior art 1."

Japanese Patent Application Publication No. 2000-264414 (FIGS. 1, 2, 4 and 5) describes two types of circuit board transportation devices different from the one described in prior art 1. One of the circuit board transportation devices (shown in FIGS. 4 and 5) has conveyor belts configured by flat belts, wherein a lower surface of a circuit board is supported in the entire cross direction (lateral direction) of the conveyor belts. A pair of right and left guide members are disposed on the outside of the right and left conveyor belts respectively to guide the circuit board in such a manner as to sandwich it from the outside of the conveyor belts. Such a circuit board transportation mode is referred to hereinafter as "prior art 2."

The other circuit board transportation device described in Japanese Patent Application Publication No. 2000-264414 (shown in FIGS. 1 and 2) transports a circuit board by using a conveyor belt provided with a guide function. This circuit board transportation device is referred hereinafter to as "prior art 3." In this prior art 3, inner ends of the conveyor belts in the cross direction support a lower surface of a circuit board and function as transporting units for transporting the circuit board. In each of these conveyor belts, an outer end in the cross direction that is linked to each inner end (transporting unit) projects upward, and this projection functions as a guide portion by holding the outside of the circuit board.

Although these types of circuit board transportation modes have conventionally been developed, applicability thereof to circuit board working apparatuses is limited, leading to a problem with versatility.

In prior art 1, for instance, each of the guide members covers from above the outer end of the conveyor belt in the cross direction, and a gap is formed between the lower surface of each guide member and the corresponding conveyor belt and expands toward the circuit board. When a circuit board to be transported is relatively thin ("thin circuit board"), the thin circuit board enters such a gap and becomes stuck therein. Thus, prior art 1 can only transport a circuit board that is sufficiently thicker than the gap ("thick circuit board").

Prior art 2, on the other hand, has an impact on the width that allows leeway for the conveyor belt to support the circuit board (support width), because the lower surface of the circuit board is supported in the entire cross direction of the conveyor belt. In other words, while the width of each conveyor belt needs to be made equal to or less than the support width, when parts are mounted on the circuit board the support width corresponding to the surface mounted with the parts becomes extremely narrow. This situation reduces the cross-sectional area of the conveyor belt, making it difficult to secure sufficient belt strength. Consequently, transporting a relatively heavy circuit board stretches the conveyor belt, making it difficult to transport the circuit board correctly. This also might cause breakage of the belt. For these reasons, prior art 2 can only transport relatively light circuit boards.

In prior art 3, each guide portion for guiding a circuit board is linked to a corresponding transporting unit and projects upward. Because a conveyor belt is normally made of a flexible material, each guide portion undergoes a lateral load from the circuit board each time when guiding the circuit board in the cross direction. Such repeated application of the lateral load to each guide portion repeatedly applies shear force to the part or so-called joint where the guide portion and the transporting unit are connected to each other, leading to problems such as cracking of the joint of the guide portion and breakage of the guide portion. As a result, the circuit board cannot be transported stably.

SUMMARY OF THE INVENTION

An object of the present invention is to provide a circuit board transportation device of excellent stability and versatility capable of stably transporting various types of circuit boards, a circuit board working apparatus equipped with such a circuit board transportation device, and a conveyor belt applied to the circuit board transportation device.

The present invention is a circuit board transportation device for transporting a circuit board in a predetermined transport direction, the circuit board transportation device having: a guide member that is provided in such a manner as to extend in the transport direction and has a guide surface that comes into abutment with a circuit board from the outside of the circuit board in a perpendicular direction that is a direction perpendicular to the transport direction; a conveyor belt that extends along the guide surface in the transport direction to support an end of the circuit board positioned in the perpendicular direction; a supporting member that supports the conveyor belt from below; and a drive unit that moves the conveyor belt in the transport direction, wherein the conveyor belt has: a belt base portion that is located under the guide member and extends both ways of the perpendicular direction from the position of the guide surface; and a projection that extends upward along the guide surface from a position, in the belt base portion, closer to the circuit board than the guide surface in the perpendicular direction up to a position between upper and lower ends of the guide surface, and the conveyor belt supports the circuit board by means of the projection.

BRIEF DESCRIPTION OF THE DRAWINGS

FIG. 4 is a partial cross-sectional diagram of the circuit board transporting unit shown in FIG. 2;

FIGS. 5A to 5C are diagrams schematically showing positional relationships among a conveyor belt, a guide member, and a printed circuit board.

DETAILED DESCRIPTION OF THE PREFERRED EMBODIMENTS OF THE INVENTION

An embodiment of the present invention is described hereinafter in detail with reference to the drawings.

Figure 1:
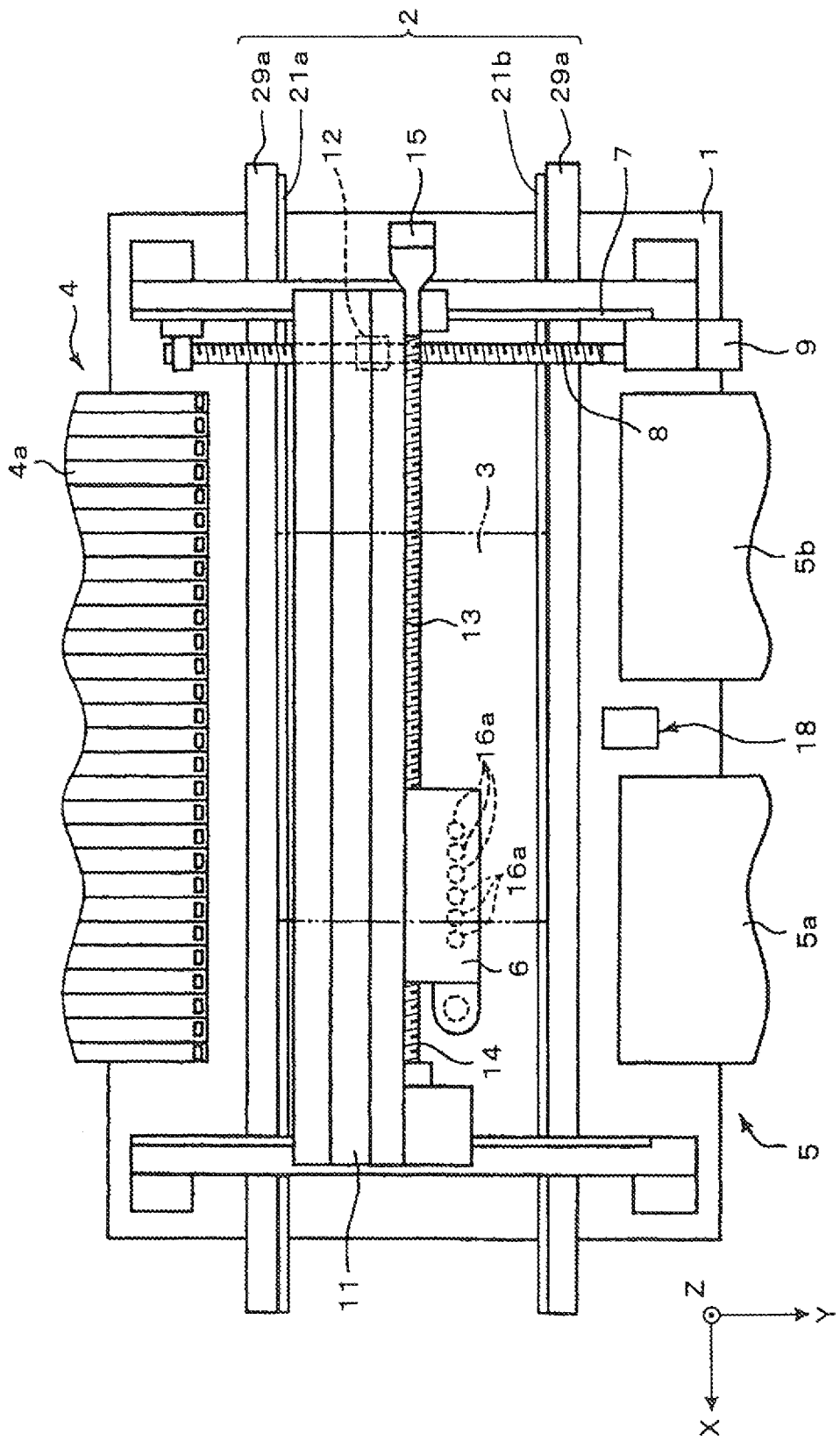
FIG. 1 is a plan view schematically showing a circuit board working apparatus equipped with a circuit board transportation device according to an embodiment of the present invention.

FIG. 1 is a plan view schematically showing a circuit board working apparatus equipped with a circuit board transportation device according to an embodiment of the present invention. A surface mounter is illustrated as the circuit board working apparatus. For the convenience of description below, FIG. 1 and subsequent diagrams described hereinafter show an XYZ orthogonal coordinate system in which the direction of transporting a circuit board in the circuit board transportation device is illustrated as "X direction," a vertical direction as "Z direction," and a direction perpendicular to the X direction (transport direction X) and the Z direction as "Y direction." In this embodiment, the Y direction corresponds to a perpendicular direction of the present invention.

The surface mounter has a base 1, as shown in FIG. 1. A circuit board transporting unit 2 corresponding to the circuit board transportation device according to the present invention is disposed on this base 1. The circuit board transporting unit 2 has a pair of conveyor belts 21a, 21b. The circuit board transporting unit 2 uses these conveyor belts 21a, 21b to transport a printed circuit board 3 (an example of a circuit board of the present invention, abbreviated as "circuit board 3," hereinafter) in the X direction while supporting a lower surface of the circuit board 3, and then stops the circuit board 3 at a predetermined mounting operation position (the position shown in FIG. 1). Upon completion of the mounting operation for mounting parts on the circuit board 3 at the mounting operation position, the circuit board transporting unit 2 transports the circuit board 3 in the X direction to the following circuit board working apparatus. Note that configurations and operations of the circuit board transporting unit 2 are described in detail hereinafter.

Part supply units 4, 5 are disposed on either side of the circuit board transporting unit 2. The part supply unit 4 (upper side in FIG. 1) out of these part supply units 4, 5 is provided with a plurality of tape feeders 4a arranged in the X direction. Each of the tape feeders 4a is configured to feed from a reel thereof a tape accommodating and holding small chips such as ICs, transistors and capacitors at predetermined intervals. The parts are extracted intermittently by a head unit 6 which is described below. Trays 5a, 5b are installed at predetermined intervals in the X direction in the other part supply unit 5. Package-type parts such as quad flat packages (QFPs) or ball grid arrays (BGAs) are arranged and placed on each of the trays 5a, 5b and can be extracted by the head unit 6.

Above the upper side of the base 1 is the head unit 6 for part attachment (corresponding to a circuit board operation unit of the present invention). The head unit 6 is configured as follows and can move in the X direction and the Y direction. In other words, a Y-direction fixed rail 7 and a ball screw shaft 8 that is driven to rotate by a Y-axis servomotor 9 are disposed on the base 1. A head unit supporting member 11 is disposed on the fixed rail 7. A nut portion 12 provided in the supporting member 11 is mounted threadably on the ball screw shaft 8. An X-direction guide member (not shown) and a ball screw shaft 14 driven by an X-axis servomotor 15 are disposed at the supporting member 11. The head unit 6 is held by the guide member 13 in such a manner as to be able to move. A nut portion (not shown) provided in the head unit 6 is mounted threadably on the ball screw shaft 14. Activating the Y-axis servomotor 9 in response to a Y-direction operation command from a control unit (not shown) for controlling the entire device moves the supporting member 11 in the Y direction. As a result, the head unit 6 moves in the Y direction. On the other hand, activating the X-axis servomotor 15 in response to an X-direction operation command from the control unit moves the head unit 6 in the X direction with respect to the supporting member 11. The head unit 6 therefore moves between the upper position of the part supply units 4, 5 and the upper position of the mounting operation position.

The head unit 6 is provided with a plurality of heads (not shown) having part suction nozzles 16a at tips thereof. Each of the heads is capable of moving up and down (in the Z direction) with respect to a frame of the head unit 6 and rotate about a nozzle central axis (R-axis: not shown), and is activated by lift drive means such as a Z-axis servomotor, not shown, or rotary drive means such as an R-axis servomotor. In the present embodiment, six of the nozzles 16a are disposed, but the number of nozzles is not limited thereto and is determined arbitrarily.

Reference numeral 18 shown in FIG. 1 represents an imaging device disposed between the trays 5a and 5b on the base 1, and recognizes the parts extracted from the part supply units 4, 5, as images, before the parts are mounted.

Figure 2:
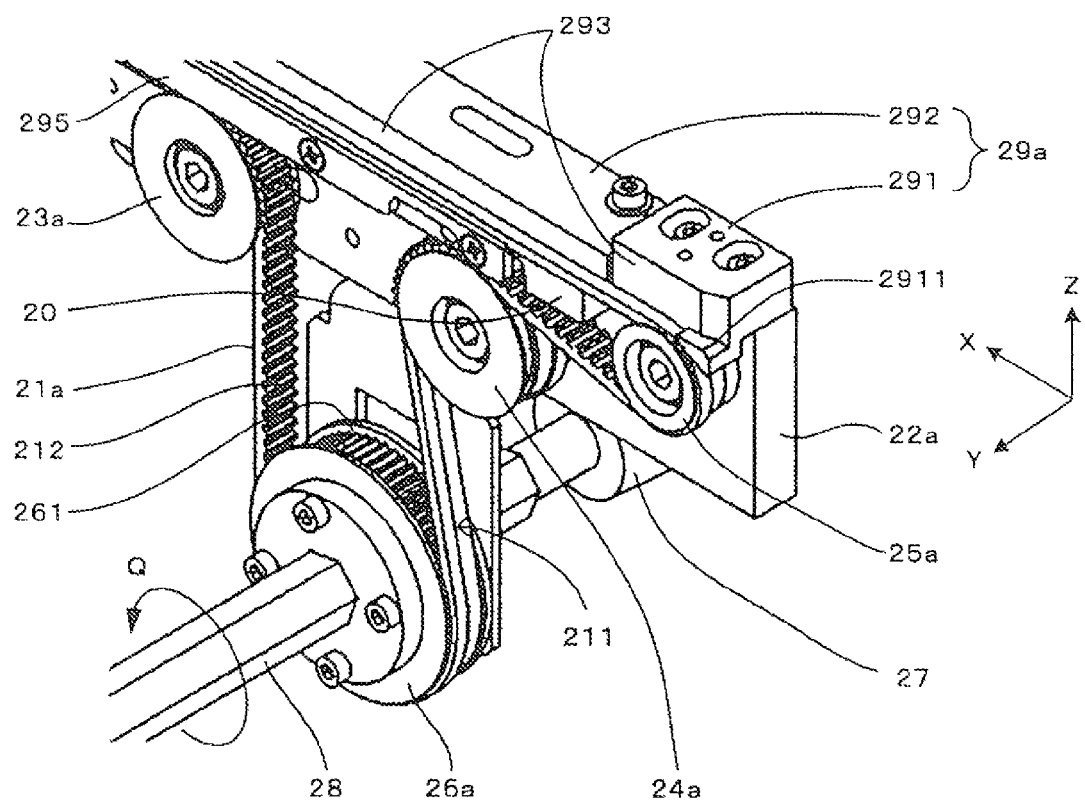
FIG. 2 is a partially enlarged perspective view of a circuit board transporting unit.
Figure 3:
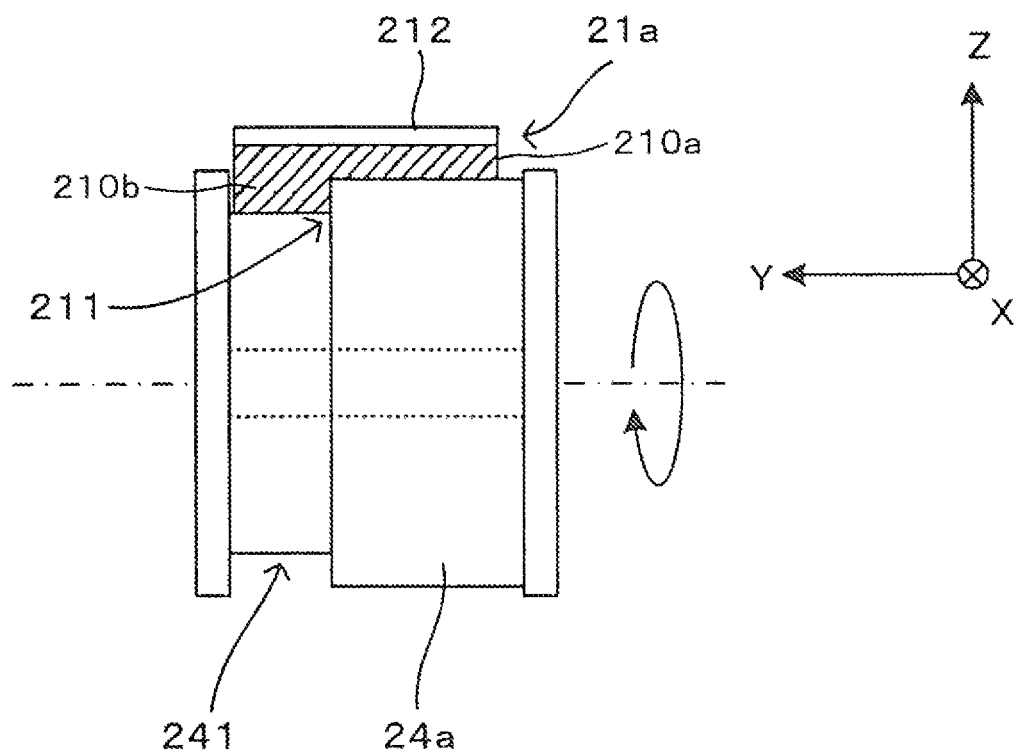
FIG. 3 is a diagram showing a configuration of a pulley with an anti-wobble function.
Figure 6:
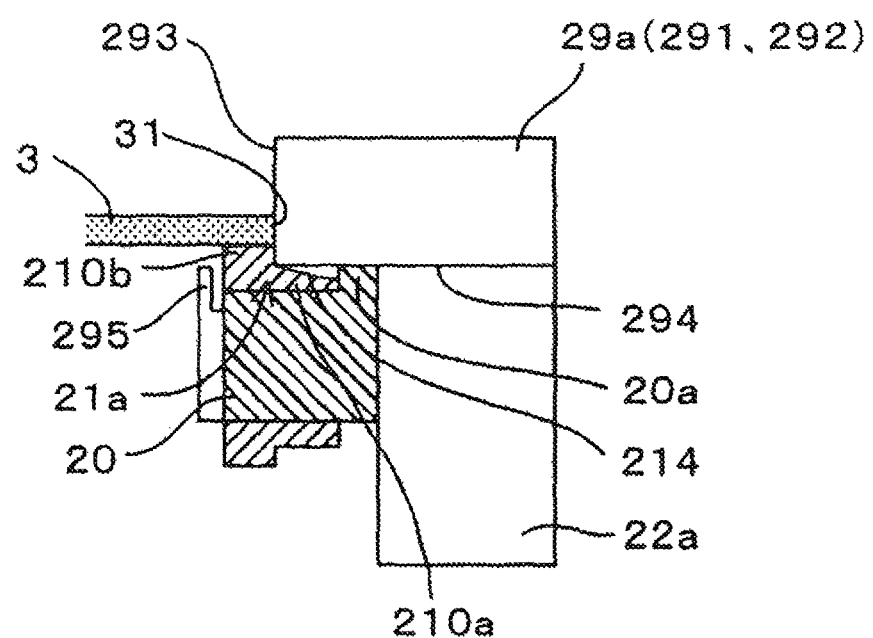
FIG. 6 is a diagram showing an alternative structure of a conveyor belt.

Configurations and operations of the circuit board transporting unit 2 are now described with reference to FIGS. 1 to 5C. FIG. 2 is a partially enlarged perspective view of the circuit board transporting unit. FIG. 3 is a diagram showing a configuration of a pulley with an anti-wobble function. FIG. 4 is a partial cross-sectional diagram of the circuit board transporting unit shown in FIG. 2. FIGS. 5A to 5C are diagrams schematically showing positional relationships among a conveyor belt, a guide member, and a circuit board, wherein FIG. 5A shows a positional relationship in the circuit board transporting unit according to the present embodiment, FIG. 5B shows a positional relationship illustrated in prior art 1, and FIG. 5C shows a positional relationship illustrated in prior art 2.

The circuit board transporting unit 2 has the two conveyor belts 21a, 21b, as described above. The conveyor belts 21a, 21b are endless toothed belts and each has on an outer circumferential surface thereof a step 211 extending in a circumferential direction and also teeth 212 on an inner circumferential surface of the same. As described hereinafter in detail, the conveyor belts 21a, 21b each have an L-shaped cross section provided with a belt base portion 210a extending in the Y direction and a projection 210b that projects radially outward from the belt base portion 210a at one end in the Y direction of the belt base portion 210a and extends continuously in the circumferential direction. On the outer circumferential surface of each of the conveyor belts 21a, 21b, the step 211 is formed between an outer circumferential surface of the projection 210b and the rest of the section, while the teeth 212 are formed on an inner circumferential surface of the belt base portion 210a.

The circuit board transporting unit 2 is configured as follows for the purpose of rotating the conveyor belt 21a of these conveyor belts 21a, 21b.

The circuit board transporting unit 2 has a transporting frame 22a extending in the transport direction X. The conveyor belt 21a is wrapped around four driven pulleys (FIG. 2 shows three pulleys 23a to 25a provided on the upstream side of the transport direction X) rotatably attached to this transporting frame 22a, and a driving pulley 26a.

As shown in FIG. 2, the driving pulley 26a is a toothed pulley that has, on an outer circumferential surface thereof, teeth 261 capable of coming into engagement with the teeth 212 formed on the conveyor belt 21a. The conveyor belt 21a is wrapped around the driving pulley 26a in such a manner that the teeth 212 come into engagement with the teeth 261 of the driving pulley 26a. The driving pulley 26a is secured to a rotating shaft 28 in the shape of a hexagonal cylinder which is attached to an axis of rotation of a drive motor 27 (not shown). According to this configuration, activating the drive motor 27 in response to a rotation command from the control unit (not shown) rotates the driving pulley 26a in the direction of arrow Q shown in FIG. 2 and consequently rotates (runs) the conveyor belt 21a to transport the circuit board 3 in the transport direction X.

In the direction of movement of the conveyor belt 21a, the driven pulley 23a is disposed on the upstream side of the driving pulley 26a (on the left-hand side of FIG. 2), while the driven pulley 24a is disposed on the downstream side of the driving pulley 26a (on the right-hand side of FIG. 2). As shown in FIG. 3, an outer circumferential surface of the driven pulley 24a on the downstream side has a groove 241 into which the projection 210b of the conveyor belt 21a is inserted. This groove 241 is made slightly wider than the projection 210b. In other words, the conveyor belt 21a is wrapped around the driven pulley 24a in such a manner that the projection 210b and the groove 241 are engaged with each other. Such a configuration can effectively prevent the conveyor belt 21a from wobbling. The driven pulley 23a provided on the upstream side is also configured in the same manner as the driven pulley 24a provided on the downstream side. In other words, the conveyor belt 21a is wrapped around the driven pulley 23a in such a manner that a groove formed on an outer circumferential surface of the driven pulley 23a (not shown) and the projection 210b are engaged with each other, so that the conveyor belt 21a can effectively be prevented from wobbling at the upstream of the driving pulley 26a.

One of the remaining two driven pulleys is the driven pulley 25a shown in FIG. 2, while the other one is disposed apart from the driven pulley 25a by a predetermined distance in the transport direction X. These remaining two driven pulleys are disposed apart in the transport direction X from each other by a distance equal to the distance of transportation of the circuit board 3 in the surface mounter (circuit board working apparatus). These driven pulleys are toothed pulleys and each has teeth capable of coming into engagement with the teeth 212 formed on the conveyor belt 21a. The conveyor belt 21a is wrapped in such a manner that the teeth 212 on its inner circumferential surface come into engagement with the teeth on the outer circumferential surfaces of these driven pulleys. In this manner, the conveyor belt 21a is stretched horizontally from the driven pulley 25a to the other driven pulley (not shown). The lower surface of the circuit board 3 is supported at a section on the inside of the outer circumferential surface of the conveyor belt 21a in a cross direction thereof (on the left-hand side in FIG. 2) in this area where the belt is stretched horizontally (referred to as "horizontal stretch area"). In other words, the outer circumferential surface of the projection 210b supports the lower surface of the circuit board 3.

In the present embodiment, the driving pulley 26a, the drive motor 27 and the like correspond to a drive unit of the present invention. The driving pulley 26a corresponds to a first pulley of the present invention, and the driven pulleys 23a, 24a correspond to a second pulley of the present invention.

In the transporting frame 22a, a guide member 29a is provided in such a manner as to come into contact from above (to press) with a section on the outside of the outer circumferential surface of the conveyor belt 21a in the cross direction (on the right-hand side in FIG. 2) in the horizontal stretch area. The guide member 29a serves to guide the circuit board 3 and, in the present embodiment, includes two types of width determining guide members 291, 292, as shown in FIG. 2 (referred to as "first width determining guide member 291" and "second width determining guide member 292" respectively). The transporting frame 22a also has a support guide 20 (corresponding to a supporting member of the present invention) that supports the conveyor belt 21a from below (on the inside of the conveyor belt 21a) in the horizontal stretch area. Note that the driven pulley 23a is attached to the transporting frame 22a in such a manner that the position of the driven pulley 23a can be adjusted in the X direction. As a result, the degree of stretchiness of the conveyor belt 21a wrapped around the driving pulley 26a and the other four driven pulleys (the driven pulley 23a, etc.) can be adjusted.

The first width determining guide member 291 is a metal or resin block body that is sufficiently thicker than the circuit board 3, and is secured to an upper surface of an upstream-side end of the transporting frame 22a in the transport direction X. The first width determining guide member 291 has a guide portion 2911 for guiding the circuit board 3, which is located on the inside with respect to the cross direction (the left-hand side in FIG. 2) at the upstream-side end in the transport direction X. The circuit board 3 carried into the surface mounter is sent to the conveyor belt 21a via this guide portion 2911. The second width determining guide member 292 is a metal or resin plate sufficiently thicker than the circuit board 3 and provided in such a manner as to extend in the transport direction X. The second width determining guide member 292 is disposed on the downstream side of the first width determining guide member 291 in such a manner as to be adjacent thereto, and is secured to an upper surface of the transporting frame 22a.

The guide member 29a (the width determining guide members 291, 292) has a substantially upright guide surface 293 on the inside of the guide member 29a in the cross direction (in (+Y) direction in FIG. 4). In other words, the circuit board 3 is guided in the X direction while having its displacement in the cross direction (Y direction) regulated, by bringing a side end surface 31 of the circuit board 3 into abutment with the guide surface 293.

The configuration of the circuit board transporting unit 2 for rotating the other conveyor belt 21b is the same as that for rotating the conveyor belt 21a. Detailed illustration of the configuration for rotating the conveyor belt 21b is omitted, but the configuration is basically the same as that for rotating the conveyor belt 21a. Specifically, the circuit board transporting unit 2 has the transporting frame 22 that is disposed apart in the Y direction from the conveyor belt 21a by a distance corresponding to the width of the circuit board 3 (circuit board size in the Y direction), four driven pulleys 23a to 25a that are rotatably attached to the transporting frame, the driving pulley 26a, and the guide member 29a (the first width determining guide member 291, the second width determining guide member 292) and support guide 20 that are secured to the transporting frame. Note that the driving pulleys 26a for driving the conveyor belts 21a, 21b are coupled to each other by the rotating shaft 28. Therefore, the conveyor belts 21a, 21b are driven integrally by using the drive motor 27 as a common drive source.

As with the prior arts, the present embodiment determines the position of the circuit board 3 in the cross direction (Y direction) by means of the guide surfaces 293 (shown in FIGS. 2, 4 and 5) provided on the inside of the pair of guide members 29a (see FIG. 1) in the cross direction, and transports the circuit board 3 in the transport direction X while allowing the pair of conveyor belts 21a, 21b to support a cross-directional end of the circuit board 3 from below. However, the present embodiment uses the conveyor belts 21a, 21b having a configuration different from those of the prior arts, and employs a relevant unique configuration. These features are described below mainly with reference to FIGS. 4 and 5. Note that the following describes the conveyor belt 21a and its relevant configuration for the sake of convenience; however, the configuration applies to the conveyor belt 21b as well.

The conveyor belt 21a has the step 211 on its outer circumferential surface, as described above. Specifically, as shown in FIG. 4, the conveyor belt 21a has the belt base portion 210a extending in the Y direction, and the projection 210b that projects radially outward from the belt base portion 210a at the area on the inside of the belt base portion 210a in the cross direction and extends in the circumferential direction. A belt width Wb of the conveyor belt 21a is wider than a support width Ws that allows leeway for the conveyor belt to support and transport the circuit board. Due to the projection 210b provided in the area corresponding to the support width Ws from the inner end in the cross direction, the step 211 is formed in a position corresponding to the support width Ws from the inner end in the cross direction. In the present embodiment, the conveyor belt 21a is produced in, for example, the following manner.

First, a plurality of reinforcing wires 213 are produced by forming core wires such as metal wires into circles, which are then arranged in the cross direction Y and disposed in a mold for a toothed endless belt. The cavity of the mold is deep. The plurality of reinforcing wires 213 arranged in the cross direction Y are disposed at the bottom of the cavity. A belt constructing material is injected into the mold, and the resultant product is removed from the mold. As a result, a toothed endless belt having the belt width Wb is produced. At this moment, the outer circumferential surface of the belt is flat. Subsequently, the entire outer circumferential surface of the belt is cut out in a direction of belt thickness (radial direction), except for the area corresponding to the support width Ws from the inner end in the cross direction (the end in the (+Y) direction in FIG. 4). In so doing, the area located radially outside of the area with the reinforcing wires 213 is cut out. As a result, in the area corresponding to the support width Ws from the inner end in the cross direction on the outer circumferential surface of the belt, the projection 210b is formed in such a manner as to project radially outward from the rest of the area. In this manner, the conveyor belt 21a with the step 211 is produced. This production method is merely an example; thus, the conveyor belt 21a of the same configuration may be produced using a different production method. For instance, a mold having the finished shape of the conveyor belt 21a (the shape where one of the main surfaces (outer circumferential surface) of the conveyor belt 21a has the step 211 and the other main surface (inner circumferential surface) has the teeth 212) may be prepared, and then a molding process using this mold may be carried out to produce the conveyor belt 21a shown in FIG. 4.

The resultant conveyor belt 21a has the belt base portion 210a that has the teeth 212 across the belt width Wb and the plurality of reinforcing wires 213 embedded, and the projection 210b with the support width Ws, which projects radially outward from the belt base portion 210a in the area on the inside of the belt base portion 210a in the cross direction. With this conveyor belt 21a wrapped around the pulleys 23a to 26a and the like, the top of the projection 210b (outer circumferential surface) having the support width Ws supports the lower surface of the circuit board 3.

While being wrapped around the pulleys 23a to 26a and the like, the conveyor belt 21a is disposed in such a manner that the belt base portion 210a extends from the position of the guide surface 293 to both ways in the Y direction under the guide member 29a, as shown in FIGS. 4 and 5A. In the outer circumferential surface of the conveyor belt 21a in the horizontal stretch area, the projection 210b extends along the guide surface 293 of the guide member 29a (extends radially outward), while the section other than the outer circumferential surface of the projection 210b (referred to as "cutout portion 214," hereinafter) is in contact with a lower end surface 294 of the guide member 29a. Furthermore, the support guide 20 is in contact with the inner circumferential surface of the conveyor belt 21a. In such a configuration, the support guide 20 and the lower end surface 294 of the guide member 29a regulate vertical displacement of the conveyor belt 21a.

Note that the support guide 20 has a protruding portion 20a (corresponding to an abutment portion of the present invention) which abuts on the outside of the conveyor belt 21a in the cross direction to regulate outward displacement of the conveyor belt 21a in the cross direction. Moreover, a belt width determining member 295 (corresponding to a regulating member of the present invention) is disposed in the support guide 20 in such a manner as to abut on the inside of the conveyor belt 21a in the cross direction to regulate inward displacement of the conveyor belt 21a in the cross direction. According to such a configuration, displacement of the conveyor belt 21a in the cross direction is controlled by the protruding portion 20a and the belt width determining member 295 of the support guide 20. As a result, the conveyor belt 21a can rotate stably.

The circuit board 3 is supported by the projection 210b of the conveyor belt 21a. The projection 210b extends along the guide surface 293 of the guide member 29a (extends radially outward). In other words, due to the presence of the projection 210b, the guide surface 293 extends to a position lower than a support level position PS for supporting the circuit board 3. Specifically, as shown in FIG. 5A, the support level position PS for supporting the circuit board 3 is located between highest level positions PH and lowest level positions PL of the guide surface 293. Thus, outward movement of the conveyor belt 21a in the cross section can be regulated by bringing the guide surface 293 into abutment on the outside of the projection 210b in the cross direction, in place of using the protruding portion 20a.

As described above, in the present embodiment, the conveyor belt 21a has the belt base portion 210a and the projection 210b and is formed to have a substantially L-shaped cross section perpendicular to the transport direction X. The projection 210b supports the lower surface of the circuit board 3 at the part of the guide surface 293 on the circuit board side (the inside in the cross direction), and the lower end surface 294 of the guide member 29a is disposed above the cutout portion 214 of the conveyor belt 21a. Such a configuration can achieve the following effects. The effects of the present embodiment are described hereinafter by contrast with prior arts 1 to 3.

In prior art 1, the lowest level position PL of a guide surface 100 (corresponding to the guide surface 293 of the present embodiment) is higher than the circuit board support level position PS, generating a gap between the lower end of the guide surface 100 and a conveyor belt 103, the gap 101 expanding toward the circuit board 3, as shown in FIG. 5B. Therefore, when the circuit board 3 is thin, the circuit board 3 can become stuck in the gap. In the present embodiment, however, the lower end of the guide surface 293 is located below the circuit board support level position PS (upper surface of the projection 210b), as shown in FIG. 5A, so there is no gap expanding toward the circuit board 3 between the lower end of the guide surface 293 and the conveyor belt 21a in the Z direction (height direction). Therefore, regardless of the thickness of the circuit board 3, the present embodiment can stably transport the circuit board 3 without causing biting thereof.

In prior art 3, the guide portion for guiding a circuit board is provided in the conveyor belt itself. Such a configuration applies a cross-directional stress directly to the conveyor belt, cracking/fracturing the conveyor belt. In the present embodiment, on the other hand, the circuit board 3 is guided by the guide surfaces 293 of the guide members 29a provided independently from the conveyor belts 21a, 21b. Therefore, a stress in the cross direction Y can be prevented from acting on the conveyor belts 21a, 21b, effectively preventing the conveyor belts 21a, 21b from cracking/fracturing. As a result, the circuit board 3 can be transported properly for a long time.

Furthermore, in prior art 2, the lower surface of the circuit board 3 is supported in the entire cross direction of a conveyor belt 110 as shown in FIG. 5C. This means that when the support width is narrow due to the condition of the lower surface of the circuit board 3, the conveyor belt 110 that is as narrow as the support width needs to be prepared, which makes it difficult to transport a heavy circuit board 3. In other words, only a few types of circuit boards can be transported. In the present embodiment, however, the conveyor belts 21a, 21b each have the projection 210b for supporting the lower surface of the circuit board 3, and the cutout portion 214 in the cross direction, wherein the belt width Wb is greater than the support width Ws of the circuit board 3, as shown in FIG. 5A. Therefore, even when the width Ws of the projection 210b needs to be reduced to match the support width Ws of the circuit board 3, the cross-sectional area of each conveyor belt 21a, 21b (the cross-sectional area of the section perpendicular to the transport direction X) can be made sufficiently large by increasing the width of the belt base portion 210a. In addition, the strength of each conveyor belt 21a, 21b can be enhanced by embedding the reinforcing wires 213 into the belt base portion 210a. As a result, not only a light circuit board 3 but also a relatively heavy circuit board 3 can be transported. In other words, various types of circuit boards can be stably transported.

The present invention is not limited to the embodiment described above, and various modifications can be made without departing from the gist of the present invention. For example, in the previously described embodiment the conveyor belts 21a, 21b are configured as toothed belts, but the configurations of these conveyor belts are not limited thereto. One or both of the conveyor belts 21a, 21b may be configured as friction transmission belts such as flat belts or V-belts.

In the previously described embodiment, each of the pulleys 23a, 24a is provided with the groove 241 that comes into engagement with the step 211 (the projection 210a) of the corresponding conveyor belt 21a, 21b, but the present invention is not limited to this configuration. For instance, only one of the pulleys 23a, 24a may be provided with the groove 241. In this case, the groove may be formed on each conveyor belt 21a, 21b, and a convex portion for engagement with the groove may be provided in each pulley 23a, 24a.

According to the embodiment, the surface of the cutout portion 214 of each conveyor belt 21a, 21b with which the guide member 29a (291, 292) comes into abutment is flat; however, this surface may be tilted downward toward the outside. In this case, the abutted surface of the guide member 29a (291, 292) is also tilted. Such a configuration can facilitate the assembly of each conveyor belt 21a, 21b to the guide member 29a (291, 292).

Moreover, in the embodiment described above, the projection 210b of each conveyor belt 21a, 21b extends continuously in the circumferential direction; however, the projection 210b may be provided in an intermittent manner in the circumferential direction. Such a configuration can improve the flexibility (bend performance) of each conveyor belt 21a, 21b, allowing it to be wrapped easily around the pulleys 23a and the like. In addition, the running stability of each conveyor belt 21a, 21b can be improved.

According to the embodiment, each conveyor belt 21a, 21b is a core wire-reinforced belt embedded with the reinforcing wires 213; however, the present invention can also be applied to a normal conveyor belt that does not have reinforcing wires embedded therein.

Furthermore, in the previously described embodiment, the circuit board transporting unit 2, an example of the circuit board transportation device according to the present invention, is applied to a surface mounter, which is an example of the circuit board working apparatus of the present invention. However, in addition to a surface mounter, the present invention can be applied to a circuit board working apparatus that carries out circuit board inspection, application of coating, printing, and reflow of a circuit board loaded with parts.

The present invention described above is now summarized below.

The present invention is a circuit board transportation device for transporting a circuit board in a predetermined transport direction, the circuit board transportation device having: a guide member that is provided in such a manner as to extend in the transport direction and has a guide surface that comes into abutment with a circuit board from the outside of the circuit board in a perpendicular direction that is a direction perpendicular to the transport direction; a conveyor belt that extends along the guide surface in the transport direction to support an end of the circuit board positioned in the perpendicular direction; a supporting member that supports the conveyor belt from below; and a drive unit that moves the conveyor belt in the transport direction, wherein the conveyor belt has: a belt base portion that is located under the guide member and extends both ways of the perpendicular direction from the position of the guide surface; and a projection that extends upward along the guide surface from a position, in the belt base portion, closer to the circuit board than the guide surface in the perpendicular direction up to a position between upper and lower ends of the guide surface, and the conveyor belt supports the circuit board by means of the projection.

The circuit board transportation device described above positions the circuit board in the perpendicular direction by allowing a side end surface of the circuit board along the perpendicular direction to come into abutment with the guide surface. With the projection of the conveyor belt supporting the circuit board, the circuit board is transported as the conveyor belt moves. At this moment, the projection of the conveyor belt extends upward along the guide surface from the position, in the belt base portion, closer to the circuit board than the guide surface in the perpendicular direction up the position between the upper and lower ends of the guide surface to support the circuit board. In other words, the lower end of the guide surface is lower than the level position of the projection that supports the circuit board (circuit board support level position). This prevents formation of a gap expanding toward the circuit board in a height direction (vertical direction), between the lower end of the guide surface and the conveyor belt. Even when the circuit board is relatively thick or thin, the circuit board transportation device can effectively prevent the circuit board from becoming stuck between the lower end surface of the guide member and the conveyor belt. In other words, the circuit board transportation device of the present invention can solve the problems of prior art 1.

The circuit board transportation device positions the circuit board in the perpendicular direction by allowing the side end surface of the circuit board to come into abutment with the guide surface of the guide member provided independently from the conveyor belt. Therefore, according to this circuit board transportation device, a stress in the perpendicular direction is not applied to the conveyor belt, preventing the conveyor belt from cracking/fracturing. In other words, the circuit board transportation device of the present invention can solve the problems of prior art 3.

Further, in the circuit board transportation device, the conveyor belt supports the circuit board by means of the projection projecting from the belt base portion, effectively preventing the conveyor belt from cracking and the like. When the width that allows leeway for the conveyor belt to support the circuit board (support width) is narrow, the width of the projection needs to be reduced accordingly. However, even if the width of the projection (width in the perpendicular direction) needs to be reduced to match the support width for the circuit board, a sufficiently large cross-sectional area of the conveyor belt can be secured by increasing the width of the belt base portion, enhancing the strength of the conveyor belt. Therefore, the circuit board transportation device of the present invention can solve the problems of prior art 2.

Although the projection may be provided in an intermittent manner in the transport direction in order to secure flexibility (bend performance) of the conveyor belt, it is preferred that the projection be provided in such a manner as to extend continuously in the transport direction, in order to stably support the circuit board without generating the gap.

In the circuit board transportation device, it is preferred that the conveyor belt be disposed in such a manner that the belt base portion is capable of coming into abutment with the lower surface of the guide member.

Since upward displacement of the conveyor belt is regulated by the guide member, this reasonable configuration using the guide member can stably transport the circuit board.

In the circuit board transportation device, it is preferred that the conveyor belt be disposed in such a manner that the projection is capable of coming into abutment with the guide surface.

This configuration can favorably transport a circuit board while allowing the circuit board to come into abutment with the guide surface, the circuit board having a narrow width allowing leeway for the conveyor belt to support the circuit board (support width). Having the projection in contact with the guide surface can prevent the conveyor belt from being displaced (wobbling) in the perpendicular direction.

In this case, it is preferred that the supporting member have an abutment portion that regulates displacement of the conveyor belt in the perpendicular direction by projecting upward and coming into abutment with the conveyor belt.

This configuration can prevent the conveyor belt from being displaced (wobbling) in the perpendicular direction, thereby transporting the circuit board more stably.

Note that the drive unit has a first pulley around which the conveyor belt is wrapped, and drives the first pulley to rotate to move the conveyor belt in the transport direction.

In this case, it is preferred that the conveyor belt be a toothed belt having a plurality of teeth on a surface thereof opposite to a surface thereof on the projection side, and that the first pulley be a toothed pulley that has, on an outer circumferential surface thereof, a plurality of teeth capable of coming into engagement with the teeth of the conveyor belt.

This configuration can prevent the driving pulley and the conveyor belt from sliding or the like and transmit drive force from the driving pulley to the conveyor belt more reliably.

In the circuit board transportation device described above, it is preferred that the conveyor belt be a core wire-reinforced belt that has, in the belt base portion, a core wire extending in the transport direction.

This configuration can effectively enhance the durability of the conveyor belt and therefore transport the circuit board stably for a long time.

In addition, in the circuit board transportation device, it is preferred that the drive unit include a second pulley that is a driven pulley around which the conveyor belt is wrapped and that rotates while in contact with a surface on the projection side of the conveyor belt, the second pulley having a groove into which the projection of the conveyor belt is inserted to regulate displacement of the conveyor belt in the perpendicular direction.

This configuration can prevent the moving conveyor belt from being displaced (wobbling) in the perpendicular direction. Therefore, the track of the conveyor belt can be kept constant, improving the stability of transporting the circuit board.

It is preferred that the circuit board transportation device further have a regulating member that extends along the guide surface in the transport direction and regulates displacement of the conveyor belt in the perpendicular direction by coming into abutment with the conveyor belt from the side opposite to the guide surface in the perpendicular direction.

According to this configuration, the guide member and the regulating member cooperate with each other to regulate displacement of the conveyor belt in the perpendicular direction. Therefore, displacement (wobbling) of the conveyor belt in the perpendicular direction can be prevented more accurately.

In the circuit board transportation device described above, an upper surface of the belt base portion may be tilted downward in the perpendicular direction from the projection.

This configuration enables easy insertion of the belt base portion under the guide member when assembling the conveyor belt, improving the assembly of the conveyor belt.

The circuit board working apparatus of the present invention, on the other hand, includes: a base; a circuit board transporting unit that is disposed on the base and configured by the circuit board transportation device; and a circuit board operation unit that is disposed on the base and carries out a predetermined operation on a circuit board transported to a predetermined operation position by the circuit board transporting unit.

According to this circuit board working apparatus, providing the circuit board transporting unit, configured by the circuit board transportation device, can effectively prevent the circuit board from becoming stuck between the lower surface of the guide member and the conveyor belt or prevent the conveyor belt from cracking/fracturing when carrying the circuit board in and out of the operation position.

The conveyor belt of the present invention is the one used in a circuit board transportation device having: a guide member that is provided in such a manner as to extend in a transport direction of a circuit board, and has a guide surface coming into abutment with the circuit board from the outside of the circuit board in a perpendicular direction that is a direction perpendicular to the transport direction; and the conveyor belt that extends along the guide surface in the transport direction and is driven in the transport direction while supporting an end of the circuit board positioned in the perpendicular direction, the conveyor belt having, while being incorporated in the circuit board transportation device: a belt base portion that is located under the guide member and extends both ways of the perpendicular direction from the position of the guide surface; and a projection that extends upward along the guide surface from a position, in the belt base portion, closer to the circuit board than the guide surface in the perpendicular direction up to a position between upper and lower ends of the guide surface.

Such a conveyor belt supports the circuit board by taking advantage of the projection extending radially outward from the belt base portion, and is therefore useful in the previously described circuit board transportation device.

It is preferred that the projection of this conveyor belt extend continuously in the transport direction.

This configuration can stably support the circuit board without generating the gap, achieving stable transportation of the circuit board.

This application is based on Japanese Patent application No. 2012-222834 filed in Japan Patent Office on Oct. 5, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A circuit board transportation device for transporting a circuit board in a predetermined transport direction, comprising:
   a guide member that is provided in such a manner as to extend in the transport direction and has a guide surface that comes into abutment with a circuit board from the outside of the circuit board in a perpendicular direction that is a direction perpendicular to the transport direction;
   a conveyor belt that extends along the guide surface in the transport direction to support an end of the circuit board positioned in the perpendicular direction;
   a supporting member that supports the conveyor belt from below; and
   a drive unit that moves the conveyor belt in the transport direction,
   wherein the conveyor belt has:
   a belt base portion that is located under the guide member and extends both ways of the perpendicular direction from the position of the guide surface; and
   a projection that extends upward along the guide surface from a position, in the belt base portion, closer to the circuit board than the guide surface in the perpendicular direction up to a position between upper and lower ends of the guide surface, and comes into abutment with the guide surface to thereby regulate an outward displacement of the conveyor belt, and
   the conveyor belt supports the circuit board by means of the projection.

2. The circuit board transportation device according to claim 1, wherein the projection extends continuously in the transport direction.

3. The circuit board transportation device according to claim 1, wherein the conveyor belt is disposed in such a manner that the belt base portion is capable of coming into abutment with a lower surface of the guide member.

4. The circuit board transportation device according to claim 1, wherein the drive unit includes a pulley around which the conveyor belt is wrapped, and drives the pulley to rotate to move the conveyor belt in the transport direction.

5. The circuit board transportation device according to claim 4, wherein
   the conveyor belt is a toothed belt having a plurality of teeth on a surface thereof opposite to a surface thereof on the projection side, and
   the pulley is a toothed pulley that has, on an outer circumferential surface thereof, a plurality of teeth capable of coming into engagement with the teeth of the conveyor belt.

6. The circuit board transportation device according to claim 1, wherein the conveyor belt is a core wire-reinforced belt that has, in the belt base portion, a core wire extending in the transport direction.

7. The circuit board transportation device according to claim 1, wherein the drive unit includes a pulley that is a driven pulley around which the conveyor belt is wrapped and that rotates while in contact with a surface on the projection side of the conveyor belt, the pulley having a groove into which the projection of the conveyor belt is inserted to regulate displacement of the conveyor belt in the perpendicular direction.

8. The circuit board transportation device according to claim 1, further comprising a regulating member that extends along the guide surface in the transport direction and regulates displacement of the conveyor belt in the perpendicular direction by coming into abutment with the conveyor belt from the side opposite to the guide surface in the perpendicular direction.

9. The circuit board transportation device according to claim 1, wherein an upper surface of the belt base portion is tilted downward in the perpendicular direction from the projection.

10. A conveyor belt used in a circuit board transportation device having: a guide member that is provided in such a manner as to extend in a transport direction of a circuit board, and has a guide surface coming into abutment with the circuit board from the outside of the circuit board in a perpendicular direction that is a direction perpendicular to the transport direction; and the conveyor belt that extends along the guide surface in the transport direction and is driven in the transport direction while supporting an end of the circuit board positioned in the perpendicular direction, the conveyor belt comprising, while being incorporated in the circuit board transportation device:

a belt base portion that is located under the guide member and extends both ways of the perpendicular direction from the position of the guide surface; and a projection that extends upward along the guide surface from a position, in the belt base portion, closer to the circuit board than the guide surface in the perpendicular direction up to a position between upper and lower ends of the guide surface, and comes into abutment with the guide surface.

11. The conveyor belt according to claim 10, wherein the projection extends continuously in the transport direction.

* * * * *